United States Patent
Ando et al.

(10) Patent No.: US 12,476,090 B2
(45) Date of Patent: Nov. 18, 2025

(54) METHOD OF DEPOSITING SILICON NITRIDE FILM, APPARATUS FOR DEPOSITING FILM, AND SILICON NITRIDE FILM

(71) Applicant: ULVAC, INC., Kanagawa (JP)

(72) Inventors: Yuta Ando, Kanagawa (JP); Akira Igari, Kanagawa (JP); Naoki Morimoto, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 68 days.

(21) Appl. No.: 18/259,151

(22) PCT Filed: Sep. 27, 2022

(86) PCT No.: PCT/JP2022/035867
§ 371 (c)(1),
(2) Date: Jun. 23, 2023

(87) PCT Pub. No.: WO2023/105894
PCT Pub. Date: Jun. 15, 2023

(65) Prior Publication Data
US 2024/0055239 A1    Feb. 15, 2024

(30) Foreign Application Priority Data
Dec. 9, 2021 (JP) ................. 2021-200446

(51) Int. Cl.
*C23C 14/06* (2006.01)
*C23C 14/54* (2006.01)
(Continued)

(52) U.S. Cl.
CPC .... *H01J 37/32697* (2013.01); *C23C 14/0652* (2013.01); *C23C 14/542* (2013.01);
(Continued)

(58) Field of Classification Search
CPC ............ C23C 14/0042; C23C 14/0089; C23C 14/024; C23C 14/0652; C23C 14/345;
(Continued)

(56) References Cited

U.S. PATENT DOCUMENTS

| 4,262,631 A * | 4/1981 | Kubacki ............... C23C 16/505 |
| | | 118/725 |
| 5,660,700 A | 8/1997 | Shimizu et al. |
| (Continued) | | |

FOREIGN PATENT DOCUMENTS

| JP | 7-90573 A | 4/1995 |
| JP | 2009-529242 A | 8/2009 |

OTHER PUBLICATIONS

International Search Report for PCT Patent App No. PCT/JP2022/035867 (Dec. 13, 2022).

*Primary Examiner* — Jaehwan Oh
(74) *Attorney, Agent, or Firm* — Future IP LLC; Tomoko Nakajima

(57) ABSTRACT

In a method in which inside a vacuum chamber, a silicon target and a to-be-deposited object are disposed in a positional relationship to face each other; a sputtering gas, containing therein nitrogen gas, is introduced into the vacuum chamber which is in a vacuum atmosphere; a negative potential is applied to the silicon target such that a silicon nitride film having a tensile stress is deposited in a reactive sputtering on a surface of the to-be-deposited object that is placed in an electrically floated state. The method includes steps: in which the to-be-deposited object is made to a state in which a bias potential is free from being applied thereto; and at least one of a flow ratio of the nitrogen gas to the sputtering gas, and the potential to be applied to the silicon target is controlled such that the surface of the silicon target can be maintained in a transition mode.

6 Claims, 7 Drawing Sheets

(51) Int. Cl.
*H01J 37/32* (2006.01)
*H01J 37/34* (2006.01)
*H01L 21/02* (2006.01)

(52) U.S. Cl.
CPC .... *H01J 37/32449* (2013.01); *H01J 37/3426* (2013.01); *H01L 21/0217* (2013.01); *H01L 21/02266* (2013.01); *H01J 2237/332* (2013.01)

(58) Field of Classification Search
CPC .. C23C 14/54; C23C 14/542; H01J 2237/332; H01J 37/32449; H01J 37/32697; H01J 37/3426; H01L 21/0217; H01L 21/02266; H01L 21/31
See application file for complete search history.

(56) References Cited

U.S. PATENT DOCUMENTS

| | | | |
|---|---|---|---|
| 11,384,423 B2* | 7/2022 | Nakano | C23C 14/564 |
| 2004/0094411 A1* | 5/2004 | Chistyakov | H01J 37/3266 |
| | | | 204/298.14 |
| 2007/0212893 A1 | 9/2007 | McTeer | |
| 2011/0247928 A1* | 10/2011 | Morimnoto | H01L 21/2855 |
| | | | 204/192.12 |

* cited by examiner

METHOD OF DEPOSITING SILICON NITRIDE FILM, APPARATUS FOR DEPOSITING FILM, AND SILICON NITRIDE FILM

This application is a national stage filing under 35 U.S.C. § 371 of PCT Patent Application No. PCT/JP2022/035867, filed Sep. 27, 2022, which claims priority under 35 U.S.C. § 119 to Japanese Patent Application No. 2021-200446, filed Dec. 9, 2021, which are incorporated by reference.

TECHNICAL FIELD

The present invention relates to a method of depositing (or forming) a silicon nitride film, an apparatus for depositing a film, and a silicon nitride film.

BACKGROUND ART

The above-mentioned kind of silicon nitride film is used as a hard mask, e.g., in a step of manufacturing semiconductor devices. The silicon nitride film for this kind of purpose is required to have a relatively high tensile stress (above +300 MPa) within a range of a predetermined refractive index (e.g., 2.0±0.2) and, ordinarily, the film is deposited (or formed) in a plasma CVD (chemical vapor deposition) method (see, e.g., patent document 1). When the silicon nitride film is deposited in the plasma CVD method, a silicon hydride base gas containing hydrogen atoms is generally used as a source gas. As a consequence, if hydrogen atoms are captured into the silicon nitride film to be deposited, there is a problem in that the semiconductor devices are adversely affected.

On the other hand, it is also possible to deposit the silicon nitride film in reactive sputtering. In this case, the film is deposited in a following manner, i.e.: a sputtering gas containing therein a rare gas and a nitrogen gas is introduced into a vacuum chamber which is in a vacuum atmosphere and in which a silicon target and an object on which the film is to be deposited (also referred to as "a to-be-deposited object") in a positional relationship to face each other; negative potential is applied to the silicon target; and at this time, at least one of a flow ratio of the nitrogen gas to the sputtering gas, and the potential to be applied to the silicon target is controlled, thereby depositing the film in a state in which the surface of the silicon target is maintained in a metallic mode. Most of the silicon nitride film deposited in this manner is generally known to have a compressive stress. Even if the silicon nitride film having a tensile stress were deposited, there cannot be obtained the tensile stress that is as high as that of the film deposited in the above-mentioned plasma CVD method. However, if the reactive sputtering is used in the deposition of the silicon nitride film, there is an advantage in that, as compared with the plasma CVD method, manufacturing cost can be reduced, and the like. From this point of view, there have been wishes for the development of a method of depositing, in the reactive sputtering method, a silicon nitride film having a tensile stress equivalent to that of the film deposited by the plasma CVD method.

PATENT DOCUMENTS

Patent Document 1: JP2009-84639A

SUMMARY OF THE INVENTION

Problems that the Invention is to Solve

In view of the above-mentioned points, this invention has a problem of providing: a method of depositing, in a reactive sputtering, a silicon nitride film which is capable of depositing a silicon nitride film having a relatively high tensile stress; an apparatus for depositing a silicon nitride film; and a silicon nitride film.

Means for Solving the Problems

In order to solve the above-mentioned problems, this invention is a method of depositing a silicon nitride film, comprising: disposing, inside a vacuum chamber, a silicon target and a to-be-deposited object in a positional relationship to face each other; introducing a sputtering gas, containing therein nitrogen gas, into the vacuum chamber in a vacuum atmosphere; and applying a negative potential to the silicon target such that the silicon nitride film having a tensile stress is deposited in a reactive sputtering on a surface of the to-be-deposited object that is placed in an electrically floated state. The method further comprises: making the to-be-deposited object to a state in which a bias potential is free from being applied (i.e., a state in which a bias potential is not applied) thereto; and controlling at least one of a flow ratio of the nitrogen gas to the sputtering gas, and the potential to be applied to the silicon target such that the surface of the silicon target can be maintained in a transition mode between a metallic mode and a compound mode, thereby depositing β-silicon nitride on the surface of the to-be-deposited object. In this case, the positive potential can be applied to an electrically conductive member disposed around the to-be-deposited object so as to face the plasma atmosphere that is generated within the vacuum chamber, thereby maintaining the state in which the bias potential is free from being applied to the to-be-deposited object.

Now, when the silicon nitride film is deposited in the metallic mode as in the above-mentioned known example, what is deposited will have a crystal structure of α-silicon nitride ($\alpha$-$Si_3N_4$). On the other hand, if the surface of the silicon target is maintained in the transition mode between the metallic mode and the compound mode by appropriately controlling the deposition rate and the flow ratio, what is deposited will have a crystal structure of β-silicon nitride ($\beta$-$Si_3N_4$). It has thus been found that this kind of β-silicon nitride film has a tensile stress within a range of predetermined refractive index and, in other words, that the stress of the silicon nitride film has a dependency on the deposition rate and on the flow ratio of the nitrogen gas to the sputtering gas. In addition, although it is generally known that tensile stress is likely to occur if the deposited silicon nitride film has a columnar structure, it has been found that, only by maintaining the surface of the silicon target to the transition mode, the silicon nitride film fails to become a columnar structure having regularly aligned clearance.

As a result of strenuous efforts by the inventors of this invention, they have obtained a finding in that, by disposing an electrically conductive member around the to-be-deposited object so as to face the plasma atmosphere that is generated within the vacuum chamber, and by applying a positive potential to the electrically conductive member while a film was being deposited by reactive sputtering, the film thus deposited became β-silicon nitride ($\beta$-$Si_3N_4$) of columnar structure, thereby manifesting itself a relatively high tensile stress (+300 MPa). This finding is considered to be based on the following features. That is to say, ordinarily in case the to-be-deposited object is a silicon wafer, or when the surface of the to-be-deposited object comes to be covered by silicon nitride that is relatively high in electrical resistance, the electrons in the plasma atmosphere are electrically charged so that the to-be-deposited object becomes a state in which so-called self-bias (bias potential) is being applied. In this kind of state, since the sputtered particles to be dispersed from the silicon target will reach (collide with) the to-be-deposited object with higher energy, the columnar structure will be impaired on the one hand. On the other hand, if the electrically conductive member is present around the to-be-deposited object, the electrical charging of the electrons will be relaxed (restrained) so that the self-bias to be applied to the to-be-deposited object will be reduced.

As a solution, according to this invention, there has been employed an arrangement: in which the to-be-deposited object is made to be a state in which a bias potential is free from being applied thereto; and in which at least one of a flow ratio of the nitrogen gas to the sputtering gas, and the potential to be applied to the silicon target is controlled, thereby depositing a β-silicon nitride film. The state in which "the bias potential is free from being applied to the to-be-deposited object" as referred to in this invention does not always mean to exclude, e.g., the case in which the bias potential is actively applied by the DC power supply, but also includes the state in which the electrical charging of the electrons in the plasma atmosphere is relaxed so that the self-bias to be applied to the to-be-deposited object can be lowered to the maximum extent possible. Therefore, as long as the self-bias can be lowered, this invention shall not be limited to an embodiment in which the positive potential is applied to the electrically conductive member disposed around the to-be-deposited object. By the way, as the sputtering power supply there may be employed a DC power supply, a high-frequency power supply and an AC power supply, but it is preferable to employ the DC power supply. In case the "DC electric power" is charged from the DC power supply, there shall also be included a case in which a pulsed DC electric power is charged. Further, the description to the effect that "control is made of the potential to be applied to the silicon target" includes: a case in which the potential to be applied to the silicon target is controlled by controlling the electric power of the sputtering power supply that is connected to the silicon target and also; a case in which the potential to be applied to the silicon target is controlled, to a constant current, by controlling the current of the sputtering power supply that is connected to the silicon target to thereby control the potential to be applied to the silicon target. The description as noted above shall not therefore be limited to the controlling, to constant voltage, of the potential of the sputtering power supply that is connected to the silicon target. According to this arrangement, a silicon nitride film having a relatively high tensile stress can be deposited by the reactive sputtering. Furthermore, when silicon nitride comes to get adhered to, and deposited on, the surfaces and the like, during film deposition, of deposition-prevention plates disposed inside the vacuum chamber, the plasma generated inside the vacuum chamber is likely to be dispersed, thereby making the electrical discharging unstable. In this invention, on the other hand, the presence of the electrically conductive member applied with positive potential can prevent the plasma from getting dispersed, thereby making the electrical discharging constantly stable.

In this invention, based on a regression analysis based on such experiments of this invention as related to the dependency on the flow ratio and the deposition rate, it has been confirmed that, assuming the flow ratio of the nitrogen gas to the sputtering gas is x (%), and the deposition rate of the silicon nitride film is y (Å/sec), confirmation was made that a silicon nitride film having a tensile stress higher than +300 MPa could be deposited by controlling at least one of the flow ratio of the nitrogen gas and the potential to be applied to the silicon target, in such a manner as to satisfy the following formula (1):

$$y=0.815x \cdot 7.50 \qquad (1)$$

Still furthermore, in the method of depositing a silicon nitride film according to this invention, an upstream operation shall preferably be included. The upstream operation comprises, prior to the operation of depositing the β-silicon nitride, the upstream operation inclusive of controlling at least one of the flow ratio of the nitrogen gas to the sputtering gas and the potential to be applied to the silicon target so as to deposit, on the surface of the to-be-deposited object, a seed layer of α-silicon nitride in a state in which the surface of the silicon target is maintained in the metallic mode. According to this arrangement, as a result of deposition of the β-silicon nitride on the seed crystal of α-silicon nitride, it has been confirmed that the deposited silicon nitride film had a tensile stress higher than +400 MPa in a columnar structure with a narrow clearance and regularly arranged clearance.

Further, in order to solve the above-mentioned problems, the apparatus for depositing a silicon nitride film according to this invention comprises: a vacuum chamber in which is disposed a silicon target; a stage for holding, inside the vacuum chamber, a to-be-deposited object in an electrically floated state in a manner to lie opposite to the silicon target; a gas introduction means for introducing, into the vacuum chamber in a vacuum atmosphere, a sputtering gas containing therein nitrogen gas; and a sputtering power supply for applying negative electric potential to the silicon target. The apparatus further comprises: an electrically conductive member disposed in a position around the stage inside the vacuum chamber; and a DC power supply for applying positive potential to the electrically conductive member. The silicon nitride film according to this invention is composed of β-silicon nitride of columnar structure. The silicon nitride film has a feature in having a tensile stress higher than +300 MPa within a range of refractive index of 2.0±0.2.

MODES FOR CARRYING OUT THE INVENTION

With reference to the figures, descriptions will now be made of a method of depositing a silicon nitride film, an apparatus for depositing a film, and a silicon nitride film according to embodiments of this invention based on examples in which: an object on which the film is to be deposited ("a to-be-deposited object") is made to be a silicon wafer (hereinafter referred to as "a substrate Sw"); the target is made of silicon of a predetermined purity; and argon gas and nitrogen gas are used as a sputtering gas, thereby depositing a silicon nitride film on a surface of the substrate Sw in reactive sputtering. In the following descriptions, the terms describing the directions such as up, down and the like shall be understood to be based on FIG. 1.

Figure 1:
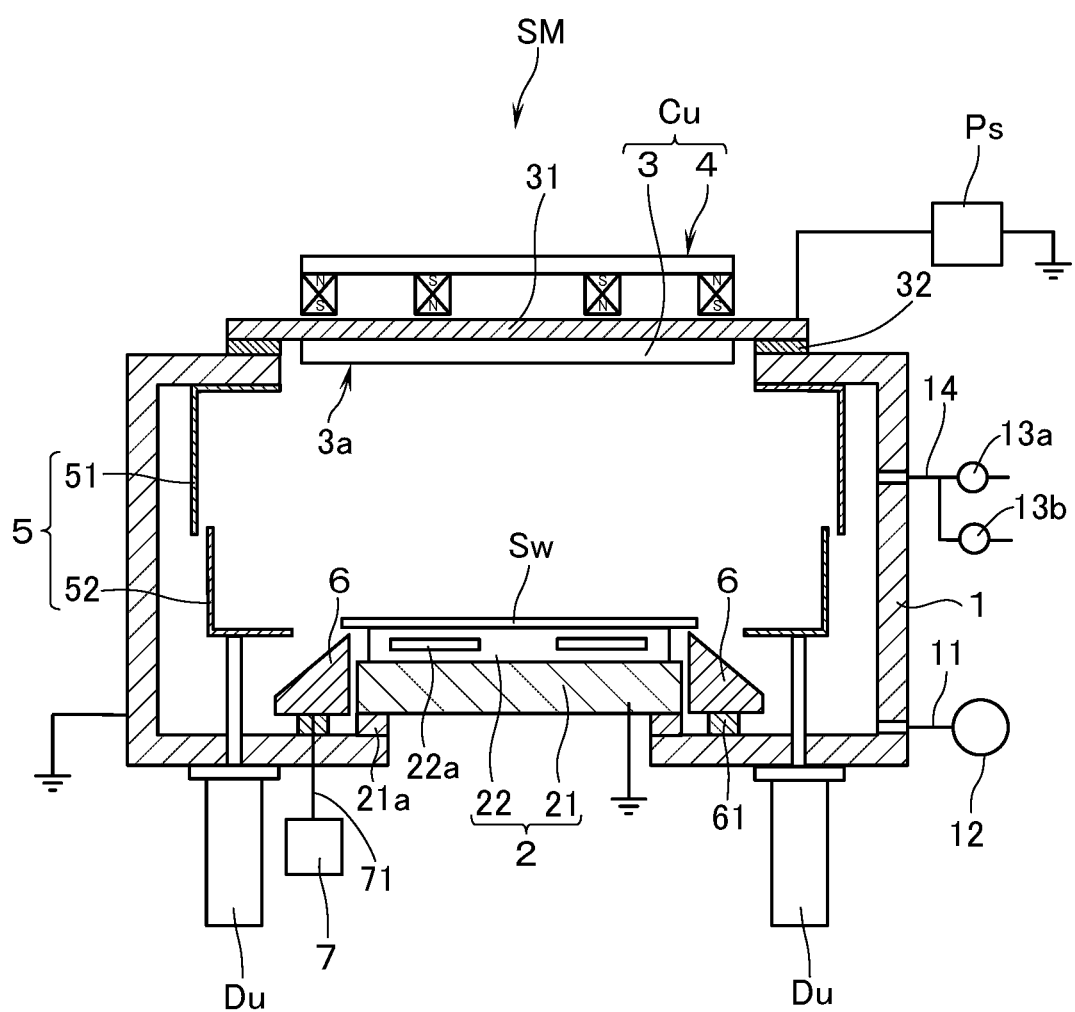
FIG. 1 is a schematic diagram illustrating an arrangement of a sputtering apparatus as an apparatus for depositing a silicon nitride film according to this embodiment.

With reference to FIG. 1, the apparatus for depositing a film according to an embodiment of this invention is a so-called magnetron sputtering apparatus SM provided with a vacuum chamber 1 which is grounded. The vacuum chamber 1 has connected thereto a vacuum pump 12 through an exhaust pipe 11 so that the vacuum chamber 1 can be internally exhausted into vacuum down to a predetermined pressure (vacuum degree). A side wall of the vacuum chamber 1 has connected thereto gas pipes 14 which are respectively interconnected to gas sources of argon gas and nitrogen gas and which have respectively interposed therein massflow controllers 13a, 13b. In this arrangement, each of the massflow controllers 13a, 13b controls the flow amount so that the sputtering gas of the argon gas and the nitrogen gas can be introduced into the vacuum chamber 1 at a predetermined flow ratio (flow ratio of the nitrogen gas to the sputtering gas). In this embodiment, the parts such as the massflow controllers 13a, 13b, the gas pipes 14 and the like constitute the gas introduction means.

The vacuum chamber 1 is provided inside thereof with a stage 2. The stage 2 has: a metallic base 21 which is disposed, through an electrically insulating body 21a, on an inside of the bottom surface of the vacuum chamber 1; and a chuck plate 22 made, e.g., of aluminum nitride or of boron nitride. The chuck plate 22 has integrated therein an electrode 22a for an electrostatic chuck. By electrically charging the electrode 22a from a power supply (not illustrated) for the chuck, the substrate Sw that is mounted with the depositing surface (i.e., the surface on which a film is deposited) facing upward can be electrostatically adsorbed (held by suction). At this time, the substrate Sw becomes an electrically floated state. Although not described by particularly illustrating, the chuck plate 22 is provided with a heating and cooling mechanism for the substrate Sw so that, during film deposition by reactive sputtering, the substrate Sw can be adjusted to a predetermined temperature.

Further, the vacuum chamber 1 is provided with a cathode unit Cu. The cathode unit Cu is provided with a target 3, and a magnet unit 4 which is disposed above the target 3 so as to cause to function leakage magnetic field in a space between the target 3 and the substrate Sw. On that side of the target 3 which is lying opposite to the sputtering surface 3a, there is joined a backing plate 31. It is thus so arranged that, when the peripheral part of the backing plate 31 is attached to an upper wall of the vacuum chamber 1 through an electrically insulating body 32, the target 3 and the substrate Sw are disposed concentrically in a positional relationship to face each other inside the vacuum chamber 1. The target 3 has connected thereto an output from a sputtering power supply Ps so that DC electric power (or pulsed DC electric power) with a negative potential can be applied. Further, inside the vacuum chamber 1 there are disposed deposition-prevention plates 5 made of stainless steel or aluminum in a manner to enclose the space between the substrate Sw and the target 3, thereby preventing the sputtered particles from getting deposited on (or adhered to) the inner walls of the vacuum chamber 1. The deposition-prevention plates 5 are made up of: upper deposition-prevention plates 51 which are suspended from an upper wall of the vacuum chamber 1; and lower deposition-prevention plates 52 which are moveable in the vertical direction by a lifting mechanism Du provided with a cylinder, motor, and the like.

Inside the vacuum chamber 1 there is provided a cylindrical block body 6 having a contour of truncated conical shape in a position around the stage 2. The block body 6 is made of aluminum or copper so as to constitute an electrically conductive member of this embodiment, and is disposed on the inside of the bottom surface of the vacuum chamber 1 through an electrically insulating body 61. In a state in which the block body 6 is installed in position, a top part of the block body 6 is arranged to be positioned either flush with or below an upper surface (surface to be deposited, or film deposition surface) of the substrate Sw that is held by the stage 2, and at least a part of the outer cylindrical surface of the block body is arranged to directly face the plasma atmosphere that is formed inside the vacuum chamber 1. It is to be noted that the configuration of the block body 6 is not to be limited to the above, but it is not always necessary to completely enclose the circumference of the stage 2. For example, the block body may be constituted by disposing, on the same circumference, a plurality of plate members each having a circular profile. The block body 6 has connected thereto an output 71 from the DC power supply 7. At the time of film deposition, the block body 6 has applied thereto positive potential by the DC power supply 7 so as to serve as an anode. Descriptions will hereinbelow be made of a first embodiment of the method of depositing a film using the above-mentioned sputtering apparatus SM.

After mounting the substrate Sw on the stage 2 and having electrostatically adsorbed it, the vacuum chamber 1 is internally evacuated. Once the vacuum chamber 1 has internally reached a predetermined pressure, while maintaining a certain practical pumping speed, the sputtering gas is introduced into the vacuum chamber 1 by the gas introduction means 13a, 13b, 14 at a predetermined flow ratio. The sputtering power supply Ps charges the target 3 with a DC electric power having a negative potential. At this time, by defining the flow ratio of the nitrogen gas to the sputtering gas to be x (%), and by defining the deposition rate of the silicon nitride film to be y (Å/sec), at least one of the flow ratio of the nitrogen gas and the potential to be applied to the target 3 is controlled so as to satisfy the following formula (1):

$$y = 0.815 \times 7.50 \tag{1}$$

(in other words, so that the sputtering surface 3a of the target 3 can be maintained in a transition mode between the metallic mode and the compound mode). In addition, positive potential (in a range, e.g., from 0V to 100V, preferably 30V) is applied to the block body 6 by the DC power supply 7. By the way, since the terms "metallic mode", "compound mode" and "transition mode" themselves are items widely known to the public, detailed description will be omitted here.

Figure 2:
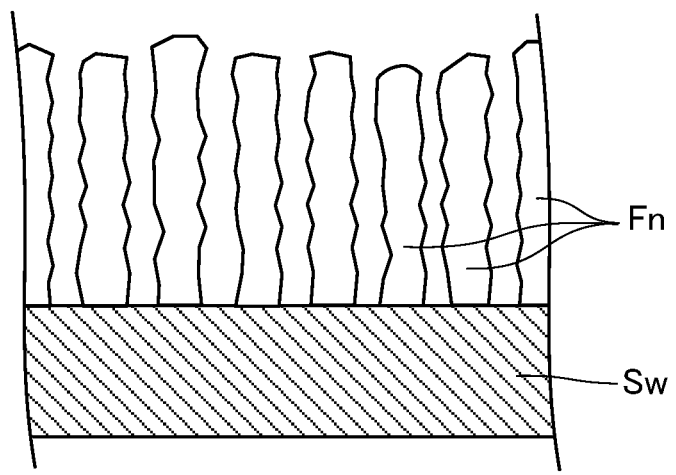
FIG. 2 is a diagram explaining the method of depositing a silicon nitride film according to a first embodiment.

According to the above-mentioned arrangement, a plasma atmosphere is formed in a space between the substrate Sw and the target 3. The target 3 gets sputtered by the ions of the rare gas in the plasma. The sputtered particles get splashed from the target 3 according to a predetermined cosine rule. As illustrated in FIG. 2, as a result of deposition of the β-silicon nitride of columnar structure as a reaction product of the sputtered particles and the nitrogen gas, a silicon nitride film Fn is deposited. By the way, in order to keep the stability in electric discharging of the plasma atmosphere that is generated inside the vacuum chamber 1, the flow ratio is preferable in a range, e.g., from 25% to 35%. In addition, as the negative potential to be applied to the target 3, a range, e.g., from 300V to 600V (range of charged electric power is, e.g., from 3.0 kW to 5.0 kW) is preferable. It has then been confirmed that the silicon nitride film Fn that was deposited as described above had a tensile stress higher than +300 MPa within a range of refractive index of 2.0±0.2. In addition, confirmation has been made that, even if the integrated electric power to the target 3 may have been increased, the diffusion of the plasma inside the vacuum chamber 1 was restrained, thereby making the electric discharging constantly stable.

Figure 3:
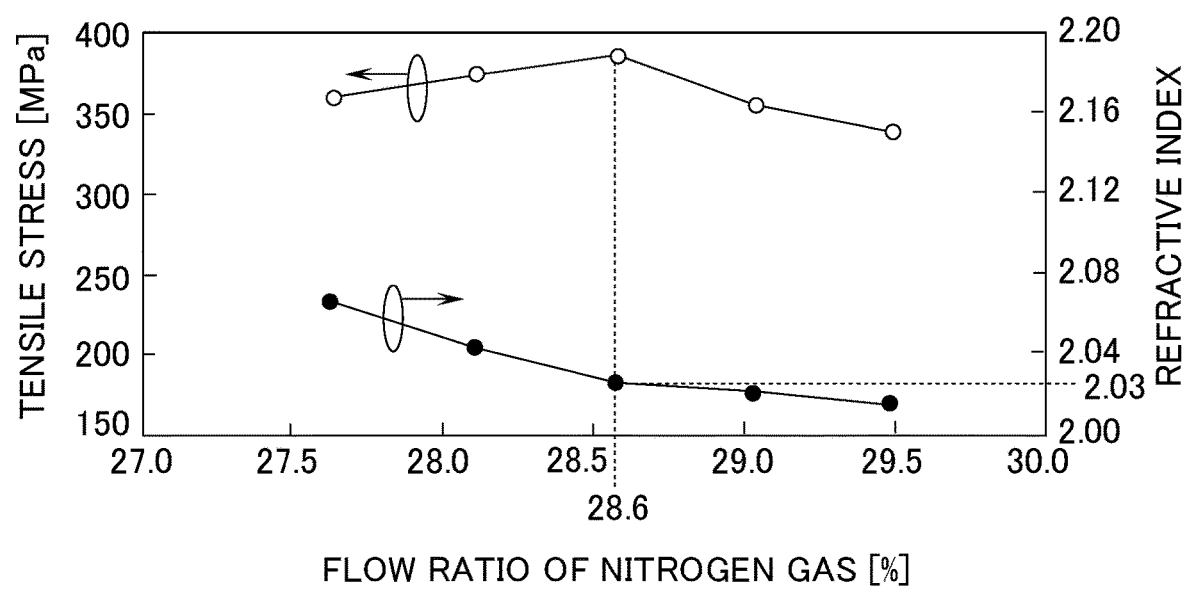
FIG. 3 is a graph illustrating the results of experiments to confirm the effects of this invention.
Figure 4:
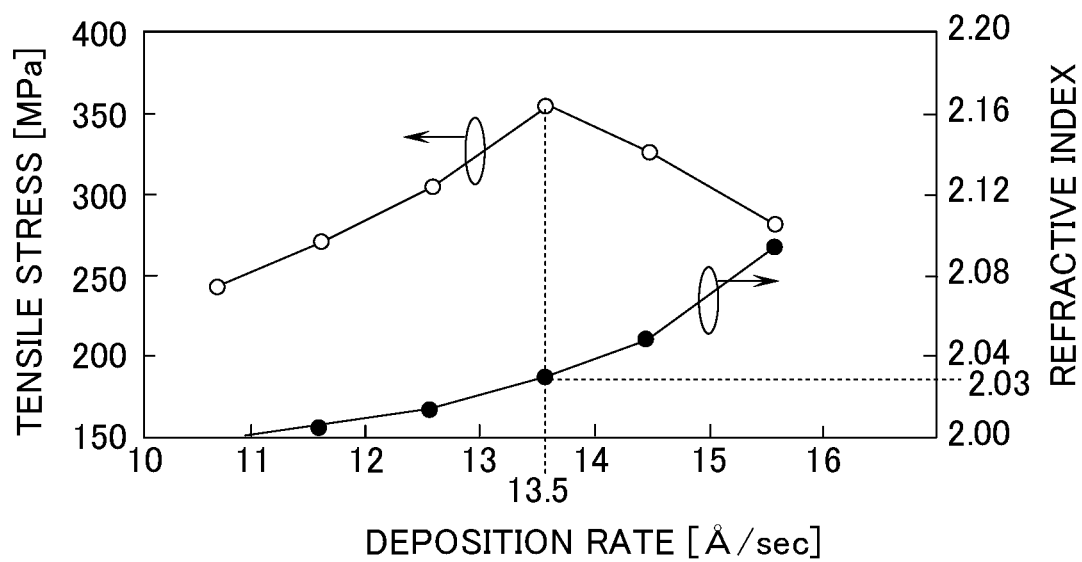
FIG. 4 is a graph illustrating the results of experiments to confirm the effects of this invention.

In order to confirm the above-mentioned effects, the following experiments were carried out using the above-mentioned sputtering apparatus SM. In a first experiment, the sputtering conditions were set to the negative potential, owned by the DC electric power to be charged to the target 3, of 550 V (DC electric power was 4.5 kW), and the potential to be applied to the block body 6 was set to 30 V. The flow ratio of the nitrogen gas was then varied in a range from 27.63% to 29.49% in a state in which the pressure inside the vacuum chamber 1 was maintained at 1.0 Pa±0.1 Pa. The tensile stress and the refractive index of the silicon nitride film Fn were respectively measured, the results being as illustrated in FIG. 3. In addition, as a second experiment, in a state in which the pressure in the vacuum chamber 1 was maintained at 1.0 Pa±0.1 Pa from the first experiment, the flow ratio of the nitrogen gas was set to 25.67%, and the potential to be applied to the target 3 and further the deposition rate was varied within a range from 10.7 Å/sec to 15.4 Å/sec, and the tensile stress and the refractive index of the silicon nitride film Fn were respectively measured, the results being as illustrated in FIG. 4.

Figure 5:
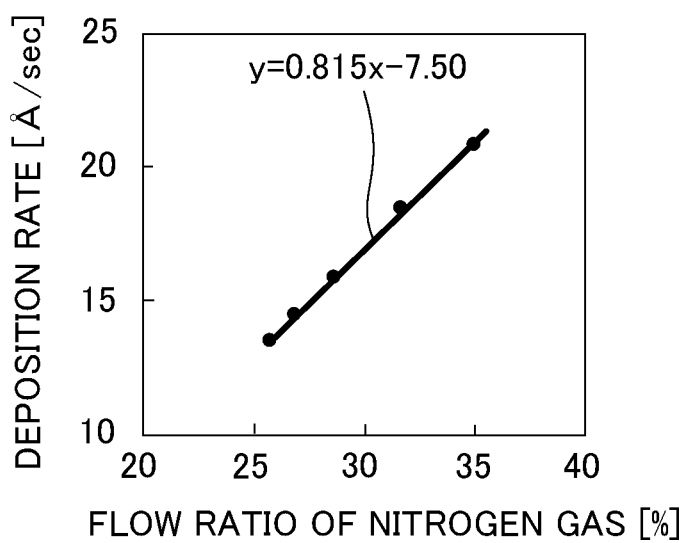
FIG. 5 is a graph illustrating the results of experiments to confirm the effects of this invention.

From the results of the first experiment and the second experiment, it can be seen that the tensile stress of the silicon nitride film Fn was dependent on the flow ratio of the nitrogen gas and the deposition rate. In this case, it has been found that, when the flow ratio of the nitrogen gas was 28.6%, and the deposition rate was 19.5 Å/sec, or when the deposition rate was 13.5 Å/sec and the flow ratio of the nitrogen gas was 25.68%, the tensile stress of the silicon nitride film was found to become maximum at the refractive index of 2.03. From the known crystal structure analysis and SEM images, what were deposited have been confirmed to have a columnar structure in crystal structure of β-silicon nitride (β-$Si_3N_4$). Further, based on regression analyses of the first experiment and the second experiment, assuming the flow ratio to be x (%), and the deposition rate to be y (Å/sec), as illustrated in FIG. 5, the formula $y=0.815 \times 7.50$ holds. By controlling at least one of the flow ratio (%) and the potential to be applied to the target 3 so as to satisfy the formula, it has been found that a silicon nitride film Fn having a tensile stress higher than +300 Å/Pa could be deposited.

Figure 6:
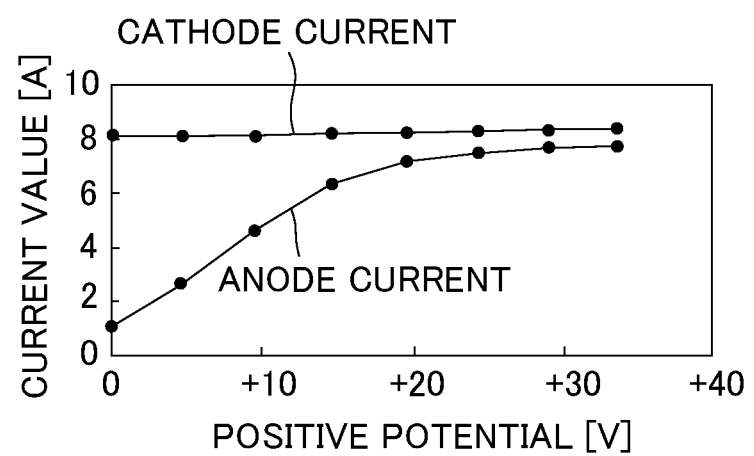
FIG. 6 is a graph illustrating the results of experiments to confirm the effects of this invention.
Figure 7:
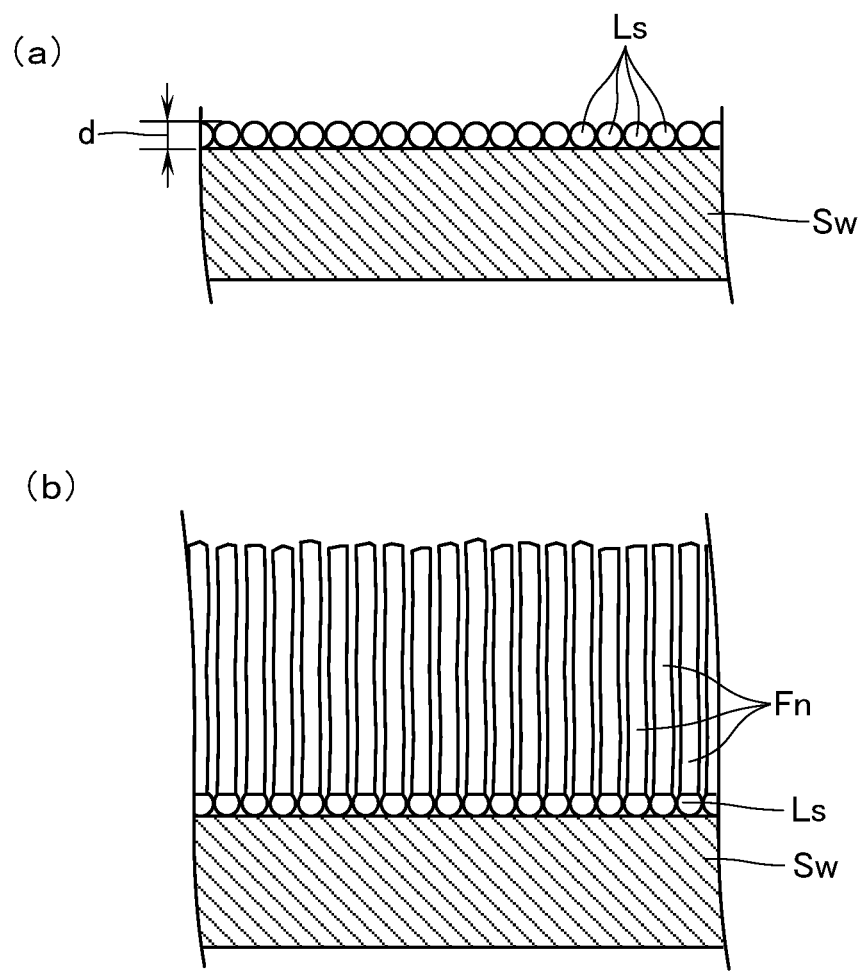
FIG. 7(a) and FIG. 7(b) are diagrams to explain the method of depositing a silicon nitride film according to a second embodiment.

Subsequently, as a third experiment, the potential to be applied to the target 3 was set, from the first experiment, to 560 V (DC electric power was 4.5 kW), and the flow ratio was set to 28.57%. By varying the potential to be applied to the block body 6 within a range from 0 V to +35 V, the current value (anode current) to flow through the block body 6 and the current value (cathode current) to flow through the target 3 were measured, the results being illustrated in FIG. 6. According to these results, when the positive potential to be applied to the block body 6 was increased, while the cathode current made little or no changes, the anode current gradually increased. Once about 30 V was exceeded, little or no change could be seen to have occurred. Judging from these results, it can be estimated that, by applying the block body 6 with positive potential, the electrons in the plasma were attracted toward the block body 6 and, as a result, the electrons electrically charged to the substrate Sw during deposition processing relatively reduced Descriptions have so far been made of the embodiments of this invention, but as long as the scope of the technical idea of this invention is not exceeded, various modifications can be made. With reference to FIG. 7, according to the deposition method of the second embodiment, there was provided an upstream operation (upstream step) prior to the operation (step) of depositing the β-silicon nitride as was the case in the above-mentioned first embodiment. The upstream operation included controlling at least one of the flow ratio of the nitrogen gas to the sputtering gas, and the potential to be applied to the silicon target so as to deposit, on the surface of the to-be-deposited object, a seed layer Ls of α-silicon nitride in a state in which the surface of the silicon target 3 was maintained in a metallic mode. In this case, the film thickness d of the seed layer Ls of the α-silicon nitride may be appropriately set within a range (e.g., 7.5 nm±5.0 nm) in which the core of the α-silicon nitride was formed. At this time, the flow ratio may be adjusted to a range from 5% to 15% (preferably 10%), the potential to be applied to the target 3 may be adjusted to such a value that the surface of the silicon target 3 can be maintained in a metallic mode, e.g., the potential is set to a range from 300 V to 600 V (electric power to be applied is set to a range from 2.0 kW to 5.0 kW, preferably 3.5 kW). Further, the block body 6 may be in a state of being applied with potential or in a state free from being applied with potential. According to this arrangement, β-silicon nitride attained a columnar structure with regular clearance in between. It has been confirmed that the silicon nitride film Fn having a tensile stress higher than +400 MPa within a range of refractive index of 2.0±0.2 was able to be obtained. In addition, descriptions have been made of examples in which the rare gas and the nitrogen gas were used as the sputtering gas. However, this invention is also applicable to a case in which the silicon nitride film is deposited by using only the nitrogen gas.

EXPLANATION OF MARKS

SM sputtering apparatus (apparatus for depositing a silicon nitride film)

Sw substrate (object on which a film is to be deposited, or "to-be-deposited object")

Fn silicon nitride film

Ls seed layer 1 vacuum chamber 13a, 13b massflow controller (constituting element of gas introduction means)

14 gas pipe (constituting element of gas introduction means)

2 stage 3 silicon target

Ps sputtering power supply 6 block body (electrically conductive member)

7 DC power supply

The invention claimed is:

1. A method of depositing a silicon nitride film, comprising:

disposing, inside a vacuum chamber, a silicon target and a to-be-deposited object in a positional relationship to face each other;

introducing a sputtering gas, containing therein nitrogen gas, into the vacuum chamber in a vacuum atmosphere;

applying a negative potential to the silicon target such that the silicon nitride film having a tensile stress is deposited in a reactive sputtering on a surface of the to-be-deposited object that is placed in an electrically floated state;

wherein the method further comprises:

making the to-be-deposited object to a state in which a bias potential is free from being applied thereto; and controlling at least one of a flow ratio of the nitrogen gas to the sputtering gas and the potential to be applied to the silicon target such that the surface of the silicon target can be maintained in a transition mode between a metallic mode and a compound mode, thereby depositing β-silicon nitride on the surface of the to-be-deposited object.

2. The method of depositing a silicon nitride film according to claim 1, further comprising applying positive potential to an electrically conductive member disposed around the to-be-deposited object so as to face the plasma atmosphere that is generated within the vacuum chamber, thereby maintaining the state in which the bias potential is free from being applied to the to-be-deposited object.

3. The method of depositing a silicon nitride film according to claim 1, assuming the flow ratio of the nitrogen gas to the sputtering gas is x(%), and the deposition rate of the silicon nitride film is y (Å/sec), further comprising controlling at least one of the flow ratio of the nitrogen gas to the sputtering gas and the potential to be applied to the silicon target, so as to satisfy the following formula (1):

$$y = 0.815 \times 7.50 \quad (1).$$

4. The method of depositing a silicon nitride film according to claim 1, further comprising an upstream operation prior to the operation of depositing the β-silicon nitride, the upstream operation including controlling at least one of the flow ratio of the nitrogen gas to the sputtering gas and the potential to be applied to the silicon target so as to deposit, on the surface of the to-be-deposited object, a seed layer of α-silicon nitride in a state in which the surface of the silicon target is maintained in the metallic mode.

5. An apparatus for depositing a silicon nitride film, wherein the silicon nitride film is composed of β-silicon nitride of columnar structure, the silicon nitride film having a tensile stress higher than +300 MPa within a range of refractive index of 2.0±0.2, the apparatus comprising:

a vacuum chamber in which is disposed a silicon target;

a stage for holding, inside the vacuum chamber, a to-be-deposited object in an electrically floated state in a manner to lie opposite to the silicon target;

a gas introduction means for introducing, into the vacuum chamber in a vacuum atmosphere, a sputtering gas containing therein nitrogen gas;

a sputtering power supply for applying negative electric potential to the silicon target, wherein the apparatus further comprises:

an electrically conductive member disposed in a position around the stage inside the vacuum chamber; and a DC power supply for applying positive potential to the electrically conductive member.

6. A silicon nitride film composed of β-silicon nitride of columnar structure, the silicon nitride film having a tensile stress higher than +300 MPa within a range of refractive index of 2.0±0.2.

* * * * *